United States Patent
Wang et al.

(10) Patent No.: US 11,095,251 B1
(45) Date of Patent: Aug. 17, 2021

(54) PERFORMANCE CALCULATION SYSTEM, PERFORMANCE CALCULATION METHOD, AND ELECTRONIC DEVICE

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Ting-Hao Wang, Hsinchu (TW); Pei-Ju Lin, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/158,022

(22) Filed: Jan. 26, 2021

(30) Foreign Application Priority Data

Oct. 19, 2020 (TW) .................................. 109136175

(51) Int. Cl.
| | |
|---|---|
| H03B 5/04 | (2006.01) |
| H03L 1/04 | (2006.01) |
| H03L 1/02 | (2006.01) |
| H03L 7/099 | (2006.01) |
| G01R 31/3183 | (2006.01) |
| H03K 19/21 | (2006.01) |

(Continued)

(52) U.S. Cl.
CPC ................ *H03B 5/04* (2013.01); *G01P 21/00* (2013.01); *G01R 31/3181* (2013.01);

(Continued)

(58) Field of Classification Search
CPC ......... H03K 2005/00019; H03K 19/21; H03K 3/0315; H03K 3/011; H03L 7/099;
(Continued)

(56) References Cited

U.S. PATENT DOCUMENTS 8,593,171 B2    11/2013 Kosonocky et al.
2013/0041608 A1    2/2013 Charlebois et al.
(Continued)

FOREIGN PATENT DOCUMENTS

TW    I534445 B    5/2016
TW    I670943 B    9/2019

OTHER PUBLICATIONS

Jongho Kim et al., Delay Monitoring System With Multiple Generic Monitors for Wide Voltage Range Operation, IEEE Transactions on Very Large Scale Integration (VLSI) Systems, vol. 26, No. 1, Jan. 2018, p. 37-49.

*Primary Examiner* — Arnold M Kinkead
(74) *Attorney, Agent, or Firm* — CKC & Partners Co., LLC

(57) ABSTRACT

A performance calculation method suitable for a chip is provided. The chip includes oscillator circuit systems configured to generate oscillation signals and to sense operation states of the chip to adjust periods of the oscillation signals. The method includes following operations: when the chip is in a first operation state, constructing a first function according to the periods of the oscillation signals and a first performance value of the chip; when the chip is in a second operation state, constructing a second function according to the periods of the oscillation signals and a second performance value of the chip; adjusting coefficients of the first or second function according to trajectories of graphs of the first and second functions, so that the graphs of the first and second functions intersect at a coordinate point; constructing a performance function of the chip according to the first and second functions.

20 Claims, 12 Drawing Sheets

(51) Int. Cl.
    *G01P 21/00*     (2006.01)
    *G06F 11/00*     (2006.01)
    *G01R 31/3185*     (2006.01)
    *H01L 21/66*     (2006.01)
    *H03K 3/011*     (2006.01)
    *G01R 31/3181*     (2006.01)
    *H03K 5/00*     (2006.01)

(52) U.S. Cl.
    CPC ............... *G01R 31/318342* (2013.01); *G01R 31/318371* (2013.01); *G01R 31/318513* (2013.01); *G06F 11/00* (2013.01); *H01L 22/34* (2013.01); *H03K 3/011* (2013.01); *H03K 19/21* (2013.01); *H03L 1/026* (2013.01); *H03L 1/04* (2013.01); *H03L 7/099* (2013.01); *H03K 2005/00019* (2013.01)

(58) Field of Classification Search
    CPC ..................... H03L 1/04; H03L 1/026; G01R 31/318371; G01R 31/3181; G01R 31/318342; G01R 31/318513; G01P 21/00; H01L 22/34; G06F 11/00; H03B 5/04
    USPC .................................. 331/2, 57; 714/726, 733
    See application file for complete search history.

(56) References Cited

U.S. PATENT DOCUMENTS

| | | |
|---|---|---|
| 2015/0109060 A1 | 4/2015 | Huang et al. |
| 2016/0380619 A1 | 12/2016 | Bollapalli et al. |
| 2018/0259581 A1 | 9/2018 | Li et al. |
| 2020/0287006 A1 | 9/2020 | Sharma et al. |

PERFORMANCE CALCULATION SYSTEM, PERFORMANCE CALCULATION METHOD, AND ELECTRONIC DEVICE

RELATED APPLICATIONS

This application claims priority to Taiwan Application Serial Number 109136175, filed Oct. 19, 2020, which is herein incorporated by reference.

BACKGROUND

Technical Field

The present disclosure relates to a performance calculation system and a performance calculation method. More particularly, the present disclosure relates to a performance calculation system and a performance calculation method suitable for integrated circuits.

Description of Related Art

Integrated circuits are widely used in various electronic devices, and the performance (e.g., the delay time) of the integrated circuit significantly affects the user experience of the electronic device. In some methods of timing analysis, performance of an integrated circuit is usually evaluated according to characteristics of signals transmitted on a critical path, since the critical path dominates the highest frequency that the integrated circuit can be operated.

SUMMARY

The present disclosure provides a performance calculation method suitable for a chip including a plurality of oscillator circuit systems. The plurality of oscillator circuit systems are configured to generate a plurality of oscillation signals and to sense operation states of the chip to adjust periods of the plurality of oscillation signals. The performance calculation method includes the following operations: when the chip is in a first operation state, constructing a first function according to the periods of the plurality of oscillation signals, and according to a first performance value of the chip or an approximate value of the first performance value; when the chip is in a second operation state, constructing a second function according to the periods of the plurality of oscillation signals, and according to a second performance value of the chip or an approximate value of the second performance value; adjusting coefficients of the first function or coefficients of the second function according to trajectories of a graph of the first function and a graph of the second function, so that the graph of the first function and the graph of the second function intersect at a coordinate point; and constructing a performance function of the chip according to the first function and the second function.

The present disclosure provides a performance calculation system including an electronic device and a chip. The chip is coupled with the electronic device, and includes a plurality of oscillator circuit systems and a control circuit. The plurality of oscillator circuit systems is configured to generate a plurality of oscillation signals, and configured to sense operation states of the chip to adjust periods of the plurality of oscillation signals. The control circuit is coupled with the plurality of oscillator circuit systems, and configured to transmit the plurality of oscillation signals to the electronic device. The electronic device is configured to conduct the following operations: when the chip is in a first operation state, construct a first function according to the periods of the plurality of oscillation signals, and according to a first performance value of the chip or an approximate value of the first performance value; when the chip is in a second operation state, construct a second function according to the periods of the plurality of oscillation signals, and according to a second performance value of the chip or an approximate value of the second performance value; adjust coefficients of the first function or coefficients of the second function according to trajectories of a graph of the first function and a graph of the second function, so that the graph of the first function and the graph of the second function intersect at a coordinate point; and construct a performance function of the chip according to the first function and the second function.

The present disclosure provides an electronic device for being coupled with a chip, in which the chip includes a plurality of oscillator circuit systems and a control circuit. The plurality of oscillator circuit systems are configured to generate a plurality of oscillation signals, and configured to sense operation states of the chip to adjust periods of the plurality of oscillation signals. The control circuit is coupled with the plurality of oscillator circuit systems, and configured to transmit the plurality of oscillation signals to the electronic device. The electronic device is configured to conduct the following operations: when the chip is in a first operation state, construct a first function according to the periods of the plurality of oscillation signals, and according to a first performance value of the chip or an approximate value of the first performance value; when the chip is in a second operation state, construct a second function according to the periods of the plurality of oscillation signals, and according to a second performance value of the chip or an approximate value of the second performance value; adjusting coefficients of the first function or coefficients of the second function according to trajectories of the graph of the first function and the graph of the second function, so that the graph of the first function and the graph of the second function intersects at a coordinate point; and construct a performance function of the chip according to the first function and the second function.

It is to be understood that both the foregoing general description and the following detailed description are by examples, and are intended to provide further explanation of the disclosure as claimed.

DETAILED DESCRIPTION

Figure 1:
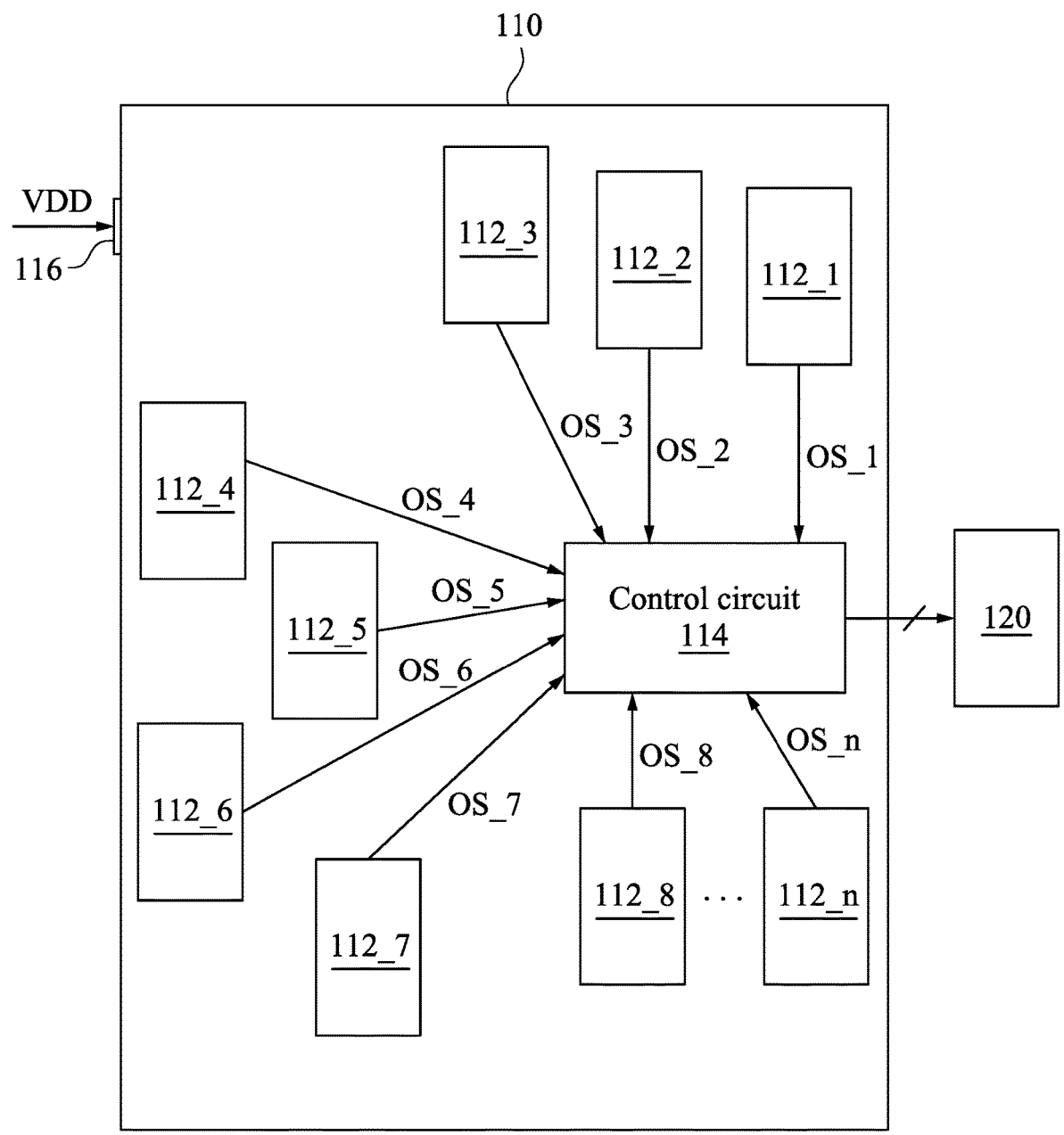
FIG. 1 is a simplified functional block diagram of a performance calculation system according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified functional block diagram of a performance calculation system 100 according to one embodiment of the present disclosure. The performance calculation system 100 comprises a chip 110 and an electronic device 120. The chip 110 comprises a plurality of oscillator circuit systems 112_1-112_n and a control circuit 114. The oscillator circuit systems 112_1-112_n are disposed at difference locations of the chip 110. The oscillator circuit systems 112_1-112_n generate a plurality of oscillation signals OS_1-OS_n having periods corresponding to variations of process, variations of voltage, variations of parasitic elements, or variations of temperature with respect to respective locations of the oscillator circuit systems 112_1-112_n. The control circuit 114 is coupled with the oscillator circuit system 112_1-112_n, and configured to receive the oscillation signals OS_1-OS_n. The control circuit 114 is further coupled with the electronic device 120, and configured to transmit the oscillation signals OS_1-OS_n to the electronic device 120.

The chip 110 further comprises an input/output (I/O) terminal 116 configured to receive an operating voltage VDD. The operating voltage VDD is for driving the chip 110, that is, the operating voltage VDD may be used to drive the oscillator circuit systems 112_1-112_n. For the sake of brevity, other functional blocks of the chip 110 are not shown in FIG. 1.

In some embodiments, the control circuit 114 may be implemented by suitable signal transmission interface circuits, such as peripheral component interconnect express (PCIe) interface circuits or universal serial bus (USB) interface circuits.

The electronic device 120 is configured to calculate, according to the oscillation signals OS_1-OS_n, performances of the chip 110 operated at different operating voltages VDD. In some embodiments, the electronic device 120 may be implemented by a chip tester, a computer, or other apparatus capable of performing logical operations.

Figure 2:
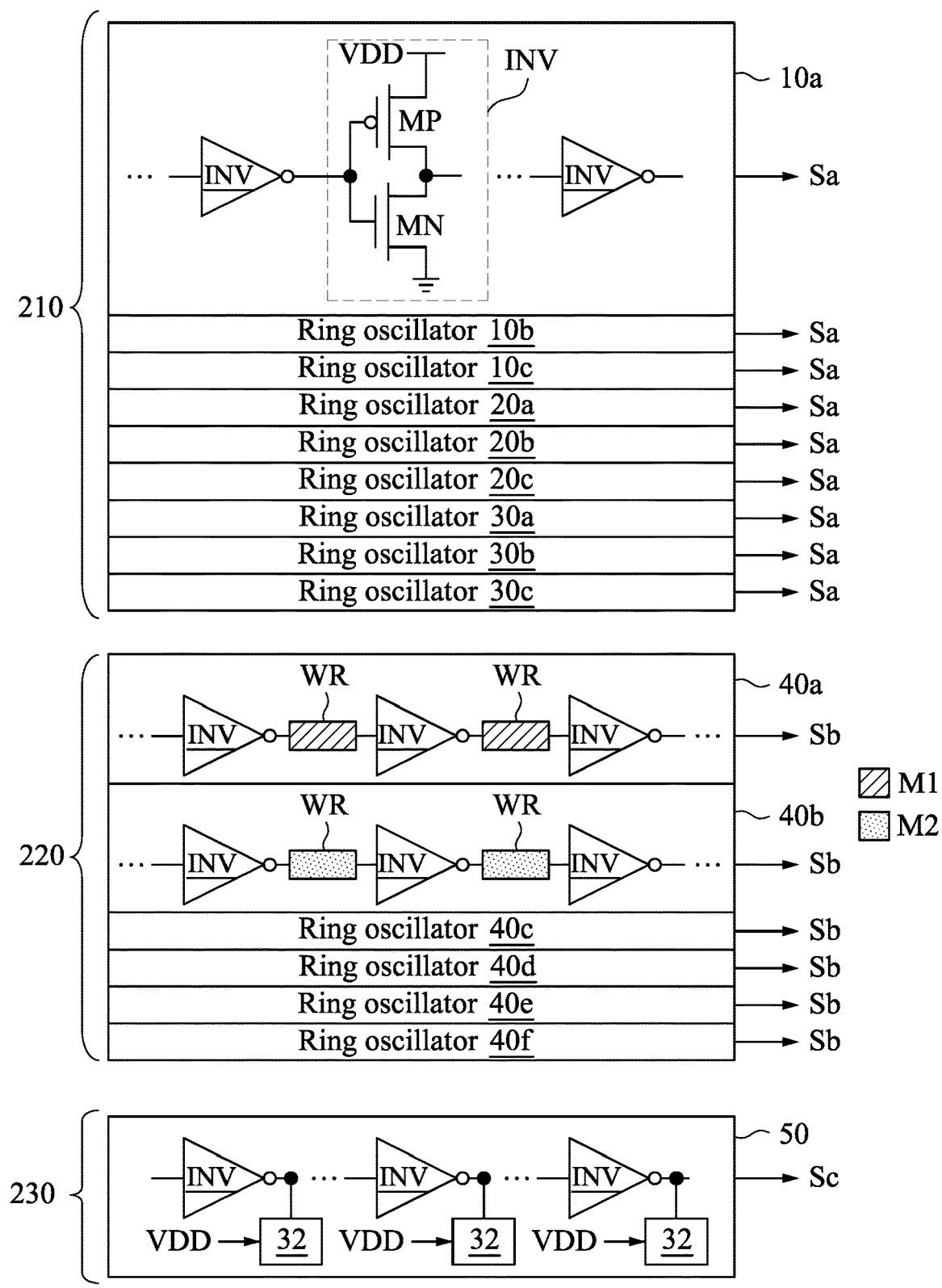
FIG. 2 is a simplified functional block diagram of an oscillator circuit system according to one embodiment of the present disclosure.

FIG. 2 is a simplified functional block diagram of an oscillator circuit system 200 according to one embodiment of the present disclosure. Each of the oscillator circuit systems 112_1-112_n of FIG. 1 may be implemented by the oscillator circuit system 200 of FIG. 2, that is, each of the oscillation signals OS_1-OS_n may be a combination of sensing signals Sa, Sb and Sc of FIG. 2.

The oscillator circuit system 200 comprises oscillator circuits 210, 220 and 230. The oscillator circuits 210, 220 and 230 are configured to respectively sense variations of process, variations of parasitic elements, and variations of voltage of the chip 110.

In specific, the oscillator circuit 210 comprises a plurality of ring oscillators 10a-10c, 20a-20c and 30a-30c. Each of the ring oscillators 10a-10c, 20a-20c and 30a-30c may be implemented by inverters INV coupled in series. An inverter INV comprises a P-type transistor MP and an N-type transistor MN connected in series, in which the P-type transistor MP is configured to receive the operating voltage VDD.

In this embodiment, the P-type transistors MP of the respective ring oscillators 10a-10c have different threshold voltages. For example, the P-type transistors MP of the ring oscillators 10a-10c have a low threshold voltage, a standard threshold voltage, and a high threshold voltage, respectively.

In addition, the N-type transistors MN of the respective ring oscillators 20a-20c have different threshold voltages. For example, the N-type transistors MN of the ring oscillators 20a-20c have a low threshold voltage, a standard threshold voltage, and a high threshold voltage, respectively.

In addition, the N-type transistor MN and the P-type transistor MP of one of the ring oscillators 30a-30c have threshold voltages different from that of the N-type transistor MN and the P-type transistor MP of other one of the ring oscillators 30a-30c. For example, the N-type transistor MN and the P-type transistor MP of the ring oscillator 30a have low threshold voltages; the N-type transistor MN and the P-type transistor MP of the ring oscillator 30b have standard threshold voltages; the N-type transistor MN and the P-type transistor MP of the ring oscillator 30c have high threshold voltages.

As a result, the oscillator circuit 210 is sensitive to variations of process, and thus periods of the sensing signals Sa may be used to reflect variations of process of the chip 110.

The oscillator circuit 220 comprises ring oscillators 40a-40f, in which each of the ring oscillators 40a-40f may be implemented by inverters INV coupled in series. Inner wires WR (i.e., connection lines between adjacent inverters INV) of the ring oscillators 40a-40f are implemented by different metal layers. For example, the inner wire WR of the ring oscillator 40a is implemented by a first metal layer M1. As another example, the inner wire WR of the ring oscillator 40b is realized by a second metal layer M2, and so on.

As a result, the ring oscillators 40a-40f are sensitive to variations of parasitic elements (e.g., variations of parasitic resistors and parasitic capacitors caused by metal wirings), and thus periods of the sensing signals Sb can be used to reflect variations of parasitic elements of the chip 110.

The oscillator circuit 230 comprises a ring oscillator 50, in which the ring oscillator 50 can be implemented by inverters INV coupled in series, and a voltage control element 32 is coupled between each two adjacent inverters INV. That is, the voltage control element 32 can be deemed as a load of the inverter INV. The operating voltage VDD is used for driving the inverters INV, and also for setting impedance of the voltage control elements 32. For example, the voltage control elements 32 may be implemented by voltage-controlled capacitors having capacitance value varies with the operating voltage VDD.

As a result, the ring oscillator 50 is sensitive to variations of the operating voltage VDD, and thus a period of the sensing signal Sc can be used to reflect variations of the operating voltage VDD.

Accordingly, since each of the oscillation signals OS_1-OS_n of FIG. 1 is a combination of the sensing signals Sa, Sb and Sc of FIG. 2, a period of each of the oscillation signals OS_1-OS_n can be used to reflect variations of process, parasitic elements, and the operating voltage VDD of a corresponding location thereof. In addition, a number of ring oscillators included by each of the oscillator circuits 210, 220 and 230 of FIG. 2 is merely an exemplary embodiment, the number of the ring oscillators may be adjusted according to practical design requirements in some embodiments.

Figure 3A:
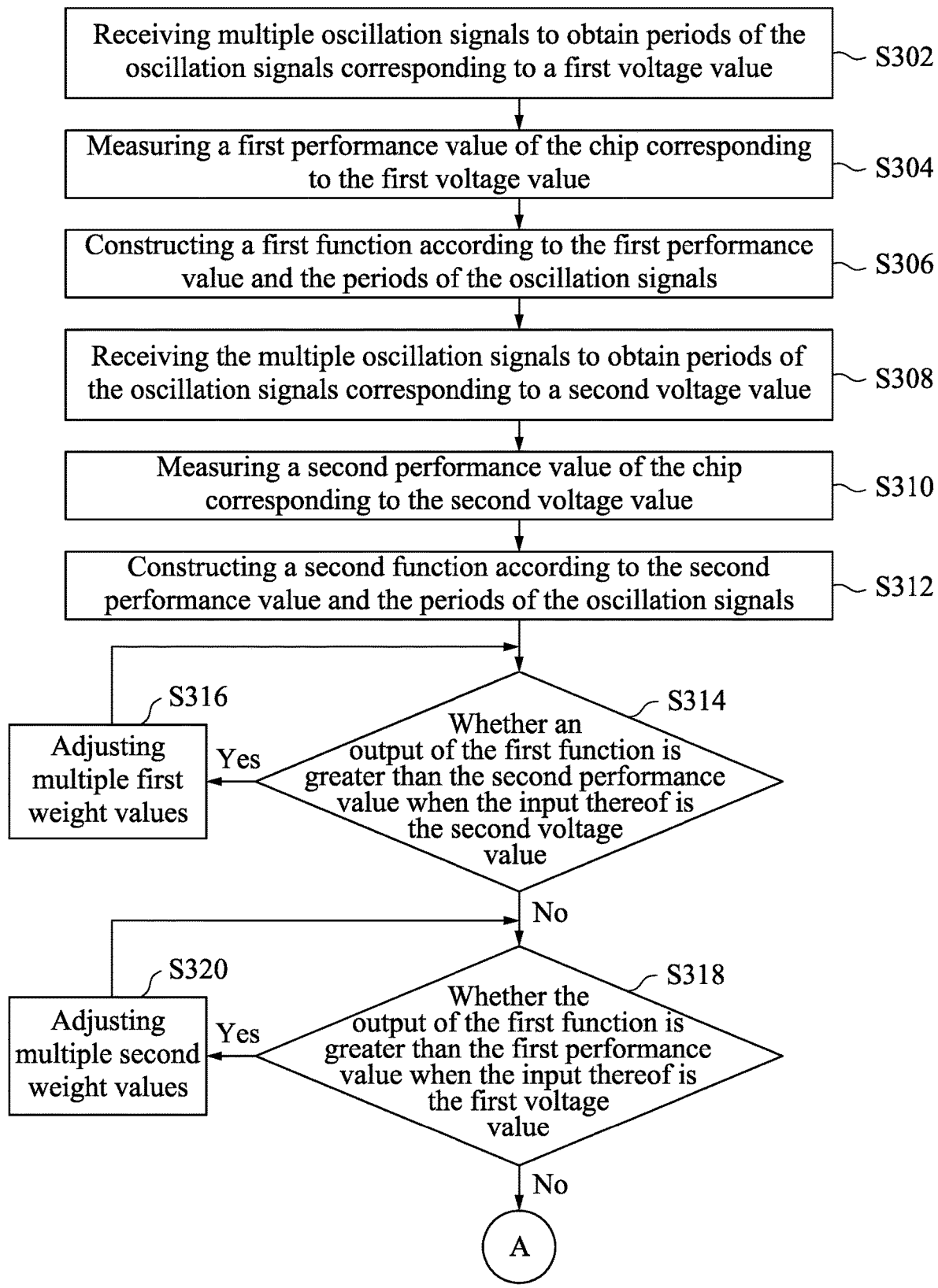
FIG. 3A shows a part of a flowchart of a performance calculation method according to one embodiment of the present disclosure.
Figure 3B:
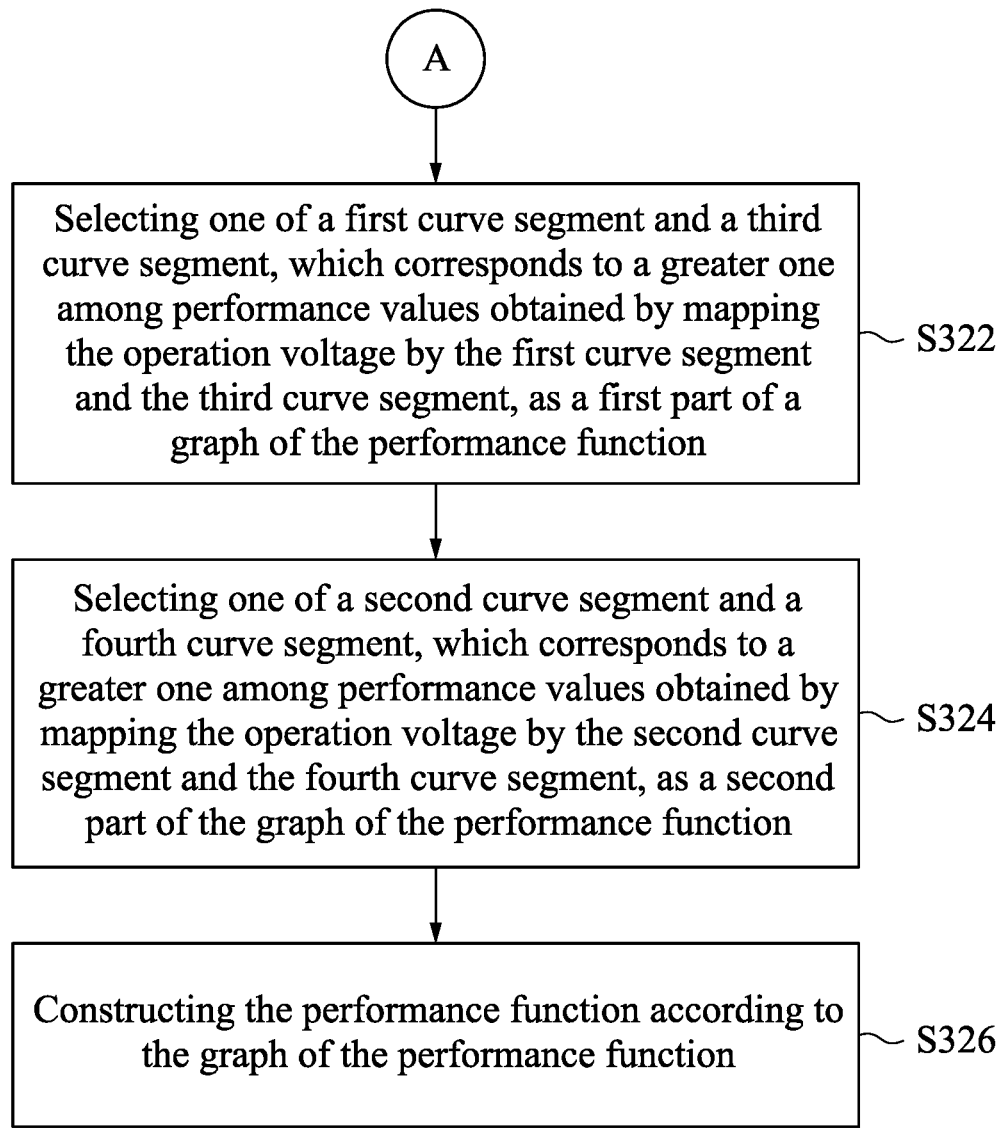
FIG. 3B shows another part of the flowchart of the performance calculation method according to one embodiment of the present disclosure.

FIG. 3A and FIG. 3B together show a flowchart of a performance calculation method 300 according to one embodiment of the present disclosure. The performance calculation system 100 of FIG. 1 may be configured to perform the performance calculation method 300 to evaluate performance of the chip 110, which will be explained by referring to FIGS. 1, 3A and 3B.

In operation S302, the electronic device 120 set the operating voltage VDD to have a first voltage value V1 to drive the oscillator circuit systems 112_1-112_n. Therefore, the electronic device 120 receives the oscillation signals OS_1-OS_n, and obtains the periods of the oscillation signals OS_1-OS_n corresponding to the first voltage value V1.

In operation S304, the electronic device 120 measuring a path (not shown) of the chip 110 to obtain a first performance value T1 of the chip 110 operated at the first voltage value V1. The said path may be a critical path of the chip 110.

In operation S306, the electronic device 120 constructs a first function, as shown by the following Formula 1, according to the first performance value T1 and the periods of the oscillation signal OS_1-OS_n. The first function will be used in the following operations to evaluate a performance function of the chip 110.

$$funa(V1) = \sum_{i=1}^{m} Ka_i \times To_i(V1) = T1 \quad \text{Formula 1}$$

In Formula 1, the symbol "funs" represents the first function; the symbol "To" represents periods of the oscillation signals OS_1-OS_n; the symbol "Ka" represents a plurality of first weight values corresponding to periods of the oscillation signals OS_1-OS_n. As described above, periods of the oscillation signals OS_1-OS_n vary with the operating voltage VDD, and thus can be expressed as functions each takes the first voltage value V1 as an input.

For constructing the first function "funs," the electronic device 120 assigns the first weight values to the periods of the oscillation signals OS_1-OS_n, respectively, that is, the first weight values are coefficients of the first function "funs." The electronic device 120 further sets the known first voltage value V1 and first performance value T1 (or an approximate value of the first performance value T1) to be an input and an output of the first function "funs," respectively, so as to evaluate the first weight values. That is, when the first function "funs" takes the first voltage value V1 as the input, the first weight values render the first performance value T1 (or the approximate value of the first performance value T1) become the output of the first function "funs." In some embodiments, a graph of the first function "funs" is depicted as a curve 410 in FIG. 4 (indicated by a solid line).

In operation S308, the electronic device 120 set the operating voltage VDD to be a second voltage value V2 to drive oscillator circuit systems 112_1-112_n. Therefore, the electronic device 120 receives the oscillation signals OS_1-OS_n, and obtains periods of the oscillation signals OS_1-OS_n corresponding to the second voltage value V2.

In operation S310, the electronic device 120 measures a path (not shown, such as the critical path) of the chip 110, so as to obtain a second performance value T2 of the chip 110 operated at the second voltage value V2.

In operation S312, the electronic device 120 constructs a second function, shown by the following Formula 2, according to the second performance value T2 and periods of the oscillation signal OS_1-OS_n. The second function will be used to evaluate the performance function of the chip 110 in the following operations.

$$funb(V2) = \sum_{i=1}^{m} Kb_i \times To_i(V2) = T2 \quad \text{Formula 2}$$

In Formula 2, the symbol "funb" represents the second function; the symbol "To" represents periods of the oscillation signals OS_1-OS_n; the symbol "Kb" represents a plurality of second weight values corresponding to periods of the oscillation signals OS_1-OS_n. Periods of the oscillation signals OS_1-OS_n can be expressed as functions each takes the second voltage value V2 as an input, which are similar to those described above, and are omitted here.

For constructing the second function "funb," the electronic device 120 assigns the second weight values to the periods of the oscillation signals OS_1-OS_n, that is, the second weight values are coefficients of the second function "funb." The electronic device 120 further sets the known second voltage value V2 and second performance value T2 (or an approximate value of the second performance value T2) to be an input and an output of the second function "funb," respectively, so as to evaluate the second weight values. That is, when the second function "funb" takes the second voltage value V2 as the input, the second weight values render the second performance value T2 (or the approximate value of the second performance value T2) become the output of the second function "funb." In some embodiments, a graph of the second function "funb" is depicted as a curve 420 in FIG. 4 (indicated by a dashed line).

In some embodiments, a difference between the aforesaid first performance value T1 and the approximate value of the first performance value T1 is 0.1-1% of the first performance value T1. A difference between the second performance value T2 and the approximate value of the second performance value T2 is 0.1-1% of the second performance value T2.

In some embodiments, the electronic device 120 configures the chip 110 to operate at a first temperature in operations S302-S304, so as to obtain the first performance value T1 of the chip 110 corresponding to the first temperature. In operation S306, the electronic device 120 further sets the known first temperature and first performance value T1 (or the approximate value of the first performance value T1) to be the input and the output of the first function "funs," respectively, so as to evaluate the first weight values. Then, the electronic device 120 configures the chip 110 to operate at a second temperature in operations S308-S310, so as to obtain the second performance value T2 of the chip 110 corresponding to the second temperature. In operation S312, the electronic device 120 further sets the known second temperature and second performance value T2 (or approximate value of the second performance value T2) as the input and the output of the second function "funb," respectively, so as to evaluate the second weight values. Accordingly, the first performance value T1 and the second performance value T2 of this disclosure are measured in different operation states of the chip 110, the said different operation states may include different operating voltages VDD and/or different temperatures of the chip 110.

Then, in operations S314 and S316, the electronic device 120 determines whether trajectories of the graph of the first function "funs" (e.g., the curve 410) and the graph of the second function "funb" (e.g., the curve 420) match a predetermined rule. The said predetermined rule is that the graph of the first function "funs" and the graph of the second function "funb" intersects at a first coordinate point N1, in which the first coordinate point N1 corresponds to a third performance value T3. The electronic device 120 adjusts the first weight values of the first function "funs" and/or the second weight values of the second function "funb" according to a determination result.

In operation S314, the electronic device 120 determines that if the output of the first function "funs" is greater than or equal to the second performance value T2 when the first function "funs" takes the second voltage value V2 as the input. If so, the electronic device 120 conducts operation S316 to adjust the first weight values, so that the output of the first function "funs" becomes smaller than the second performance value T2 when the first function "funs" takes the second voltage value V2 as the input. If not, the electronic device 120 conducts operation S318.

Figure 5:
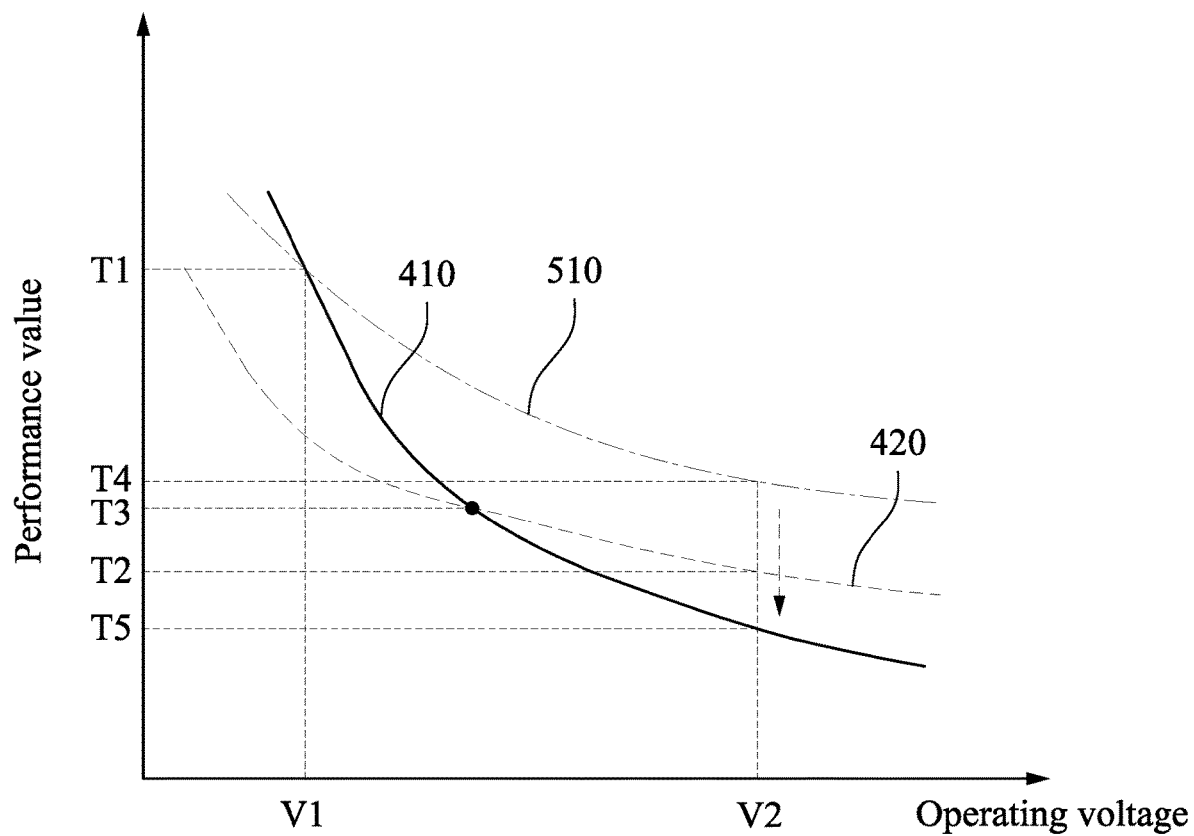
FIG. 5 is a schematic diagram illustrating process of adjusting first weight values according to one embodiment of the present disclosure.

For instance, referring to FIG. 5, the curve 510 (indicated by a dashed-dotted line) is the graph of the first function "funs" obtained by the electronic device 120 after operations S302-S306 are finished in one operation cycle. In this situation, when the first function "funs" takes the second voltage value V2 as the input, the output thereof is a fourth performance value T4. Since the fourth performance value T4 is greater than the second performance value T2, the electronic device 120 adjusts the first weight values of the first function "funb" becomes smaller than the first performance value T1 when the second function "funb" takes the first voltage value V1 as the input. If not, the electronic device 120 conducts operation S322.

Figure 6:
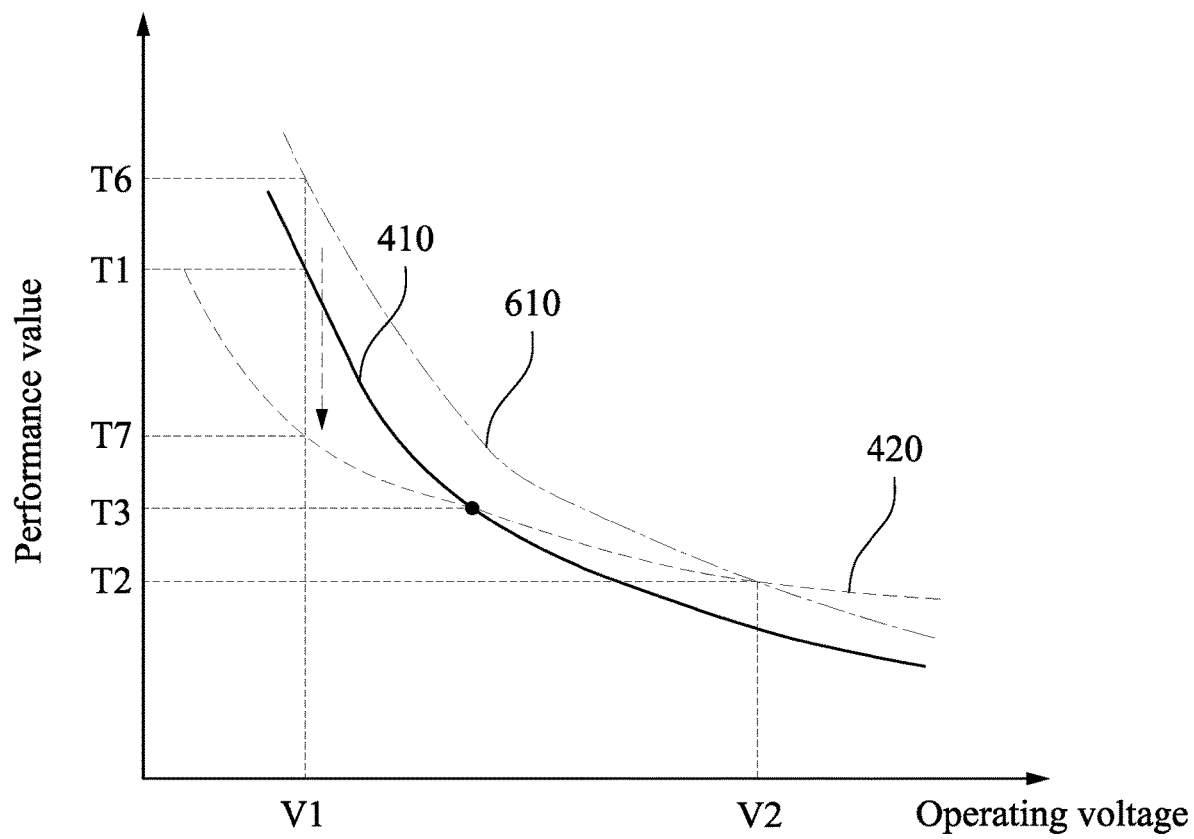
FIG. 6 is a schematic diagram illustrating process of adjusting second weight values according to one embodiment of the present disclosure.

For example, referring to FIG. 6, a curve 610 (indicated by a dashed-dotted line) is the graph of the second function "funb" obtained by the electronic device 120 after operations S308-S312 are finished in one operation cycle. In this case, when the second function "funb" takes the first voltage value V1 as the input, the output thereof is a sixth performance value T6. Since the sixth performance value T6 is greater than the first performance value T1, the electronic device 120 adjusts the second weight values of the second function "funb", until the graph of the second function "funb" becomes the curve 420, that is, until the output of the second function "funb" is a seventh performance value T7 smaller than the first performance value T1 when the second function "funb" takes the first voltage value V1 as the input.

Figure 4:
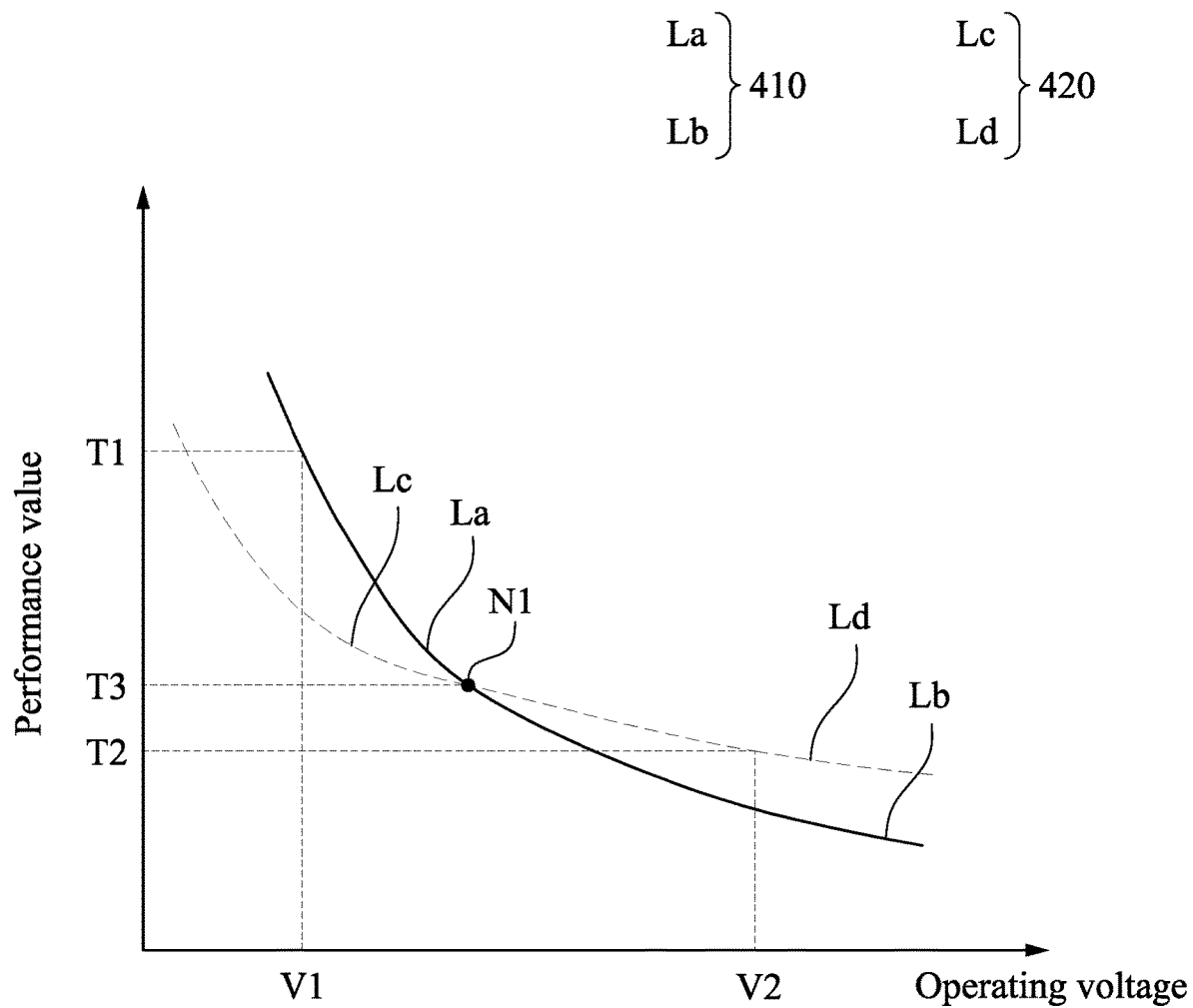
FIG. 4 is a schematic diagram of graphs of a first function and a second function according to one embodiment of the present disclosure.
Figure 7:
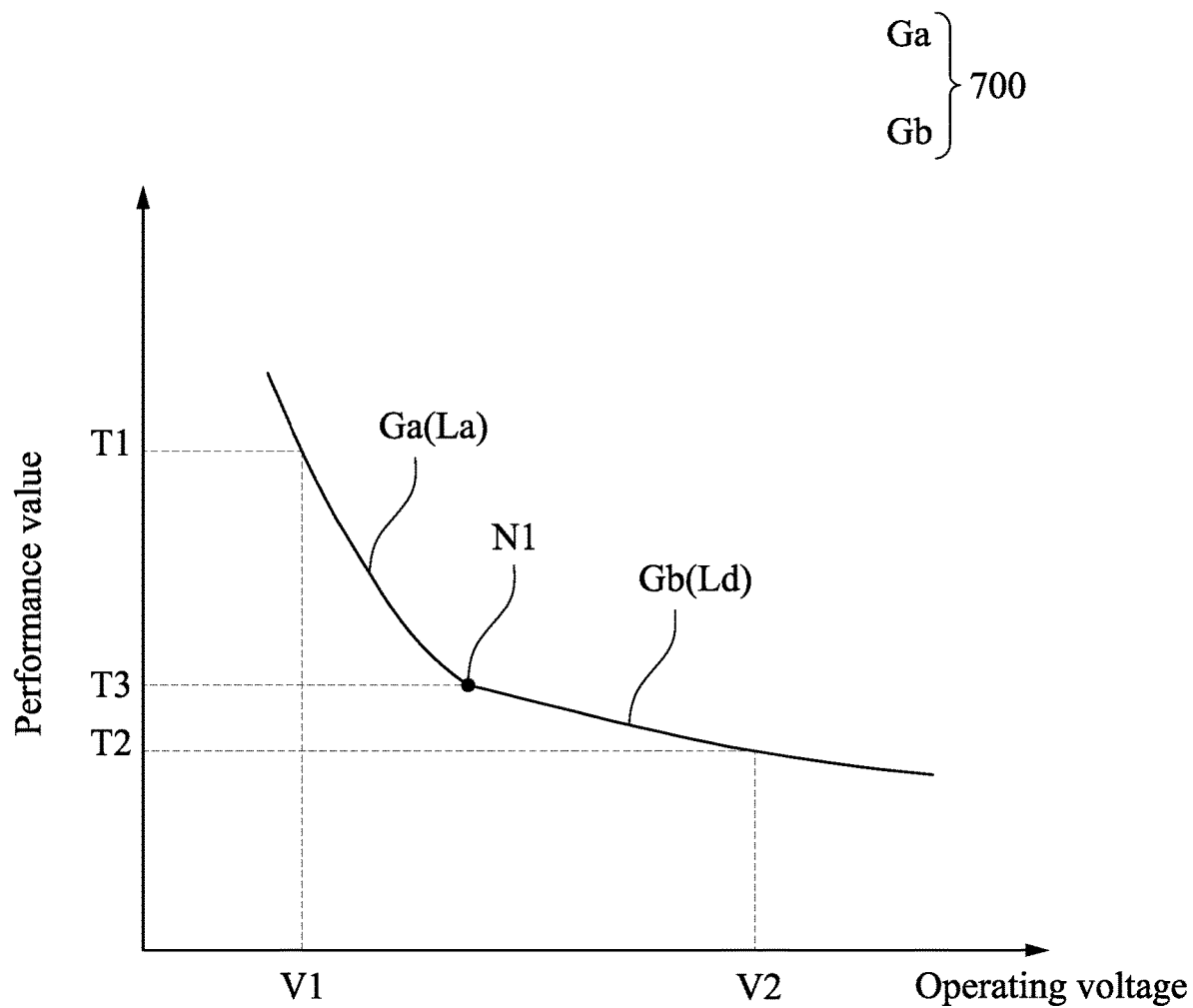
FIG. 7 is a schematic diagram of a graph of a performance function according to one embodiment of the present disclosure.

Accordingly, the electronic device 120 may execute polynomial regression or interpolation for multiple times according to performance of the chip 110 to evaluate the aforesaid first weight values "Ka" and the second weight values "Kb." Then, the electronic device 120 conducts operations S322-S326 of FIG. 3B to calculate the performance function of the chip 110 according to the first function "funs" and the second function "funb." The performance function is for evaluating corresponding performances of the chip 110 when receiving different operating voltages VDD, which will be explained by referring to FIGS. 3B, 4 and 7.

As shown in FIG. 4, the curve 410 comprises a first curve segment La and a second curve segment Lb at a left side and a right side of the coordinate point N1, respectively. The curve 420 comprises a third curve segment Lc and a fourth curve segment Ld at a left side and a right side of the coordinate point N1, respectively.

In operation S322, the electronic device 120 selects one of the first curve segment La and the third curve segment Lc, in which the selected curve segment corresponds to a greater one among two performance values of the chip 110 obtained by respectively mapping the operating voltage VDD through the first curve segment La and the third curve segment Lc, and the selected curve segment will be a first part Ga of a graph of the performance function. In this embodiment, as shown in FIG. 7, the electronic device 120 selects the first curve segment La as the first part Ga of the graph of the performance function.

In operation S324, the electronic device 120 selects one of the second curve segment Lb and the fourth curve segment Ld, in which the selected curve segment corresponds to a greater one among two performance values of the chip obtained by respectively mapping the operating voltage VDD through the second curve segment Lb and the fourth curve segment Ld, and the selected curve segment will be the second part Gb of the graph of the performance function. In this embodiment, as shown in FIG. 7, the electronic device 120 selects the fourth curve segment Ld as the second part Gb of the performance function. As a result, the electronic device 120 generate the graph of the performance function in operation S320, which is the curve 700 of FIG. 7 including the first part Ga, the second part Gb, and the coordinate point N1.

In operation S326, the electronic device 120 constructs the performance function according to the curve 700. In some embodiments, the performance of the chip 110 can be expressed by the following Formula 3, in which the symbol "funt" represents the performance function of the chip 110.

$$\text{funt}(\text{funa}(V),\text{funb}(V)) \qquad \text{Formula 3}$$

As can be known from FIG. 7, in some embodiments, outputs (i.e., the range) of the performance function comprises the first performance value T1 or the approximate value of the first performance value T1, second performance value T2 or the approximate value of the second performance value T2, and a third performance value T3 corresponding to the coordinate point N1.

Figure 8A:
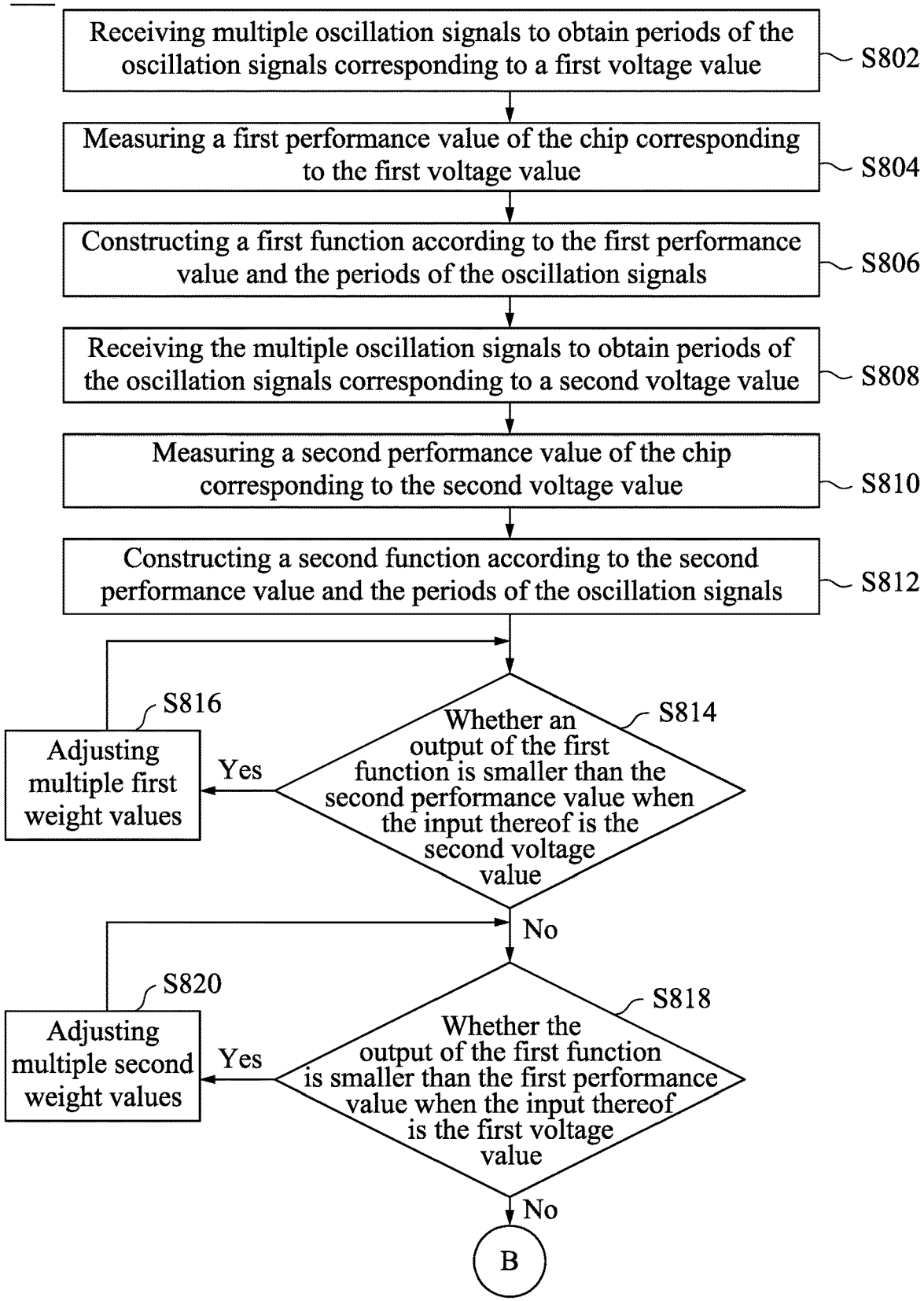
FIG. 8A shows a part of a flowchart of the performance calculation method according to one embodiment of the present disclosure.
Figure 8B:
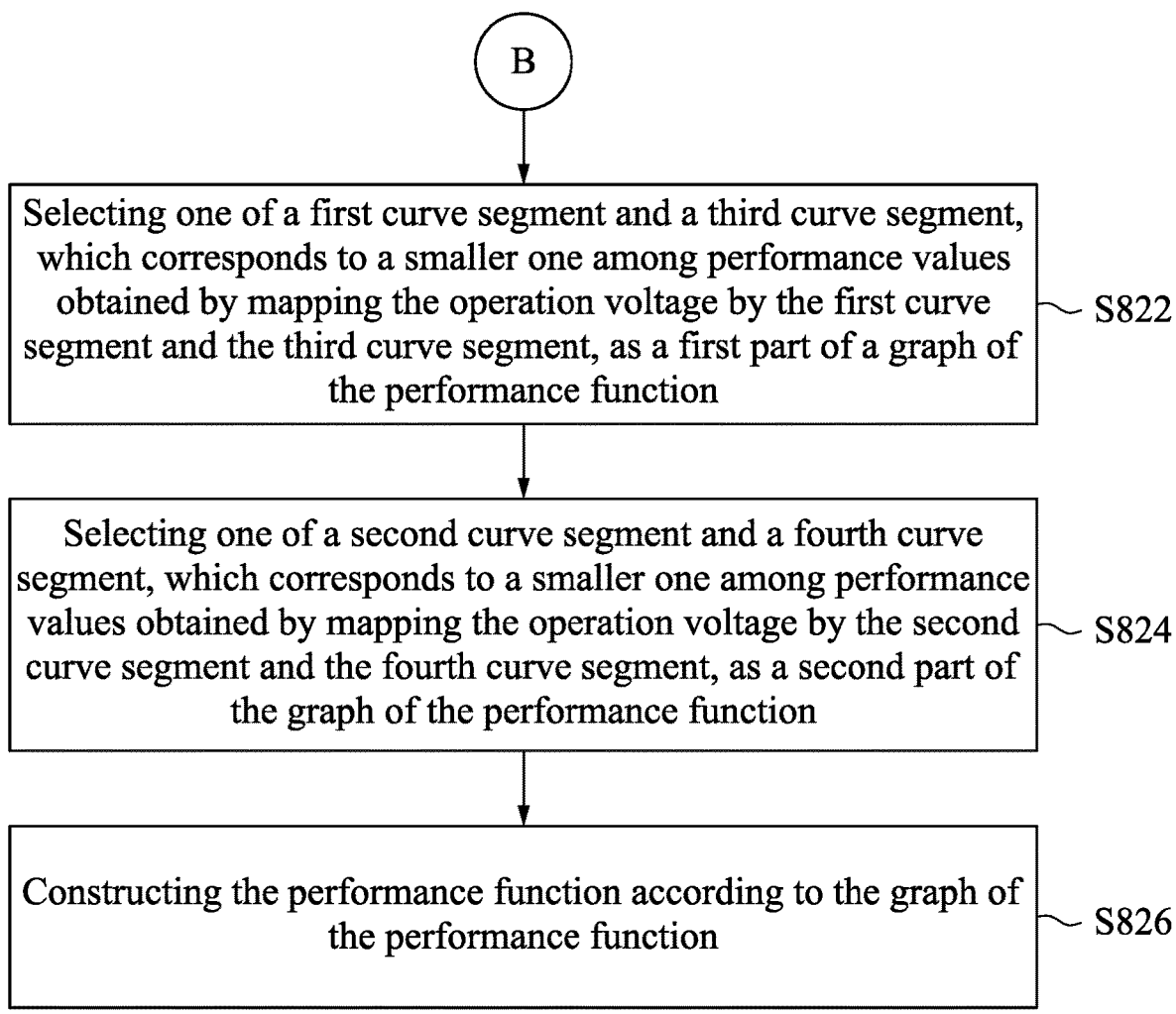
FIG. 8B shows another part of the flowchart of the performance calculation method according to one embodiment of the present disclosure.

FIG. 8A and FIG. 8B together show a flowchart of a performance calculation method 800 according to one embodiment of the present disclosure. The performance calculation system 100 of FIG. 1 can be configured to execute the performance calculation method 800 to evaluate the performance of the chip 110. Operations S802-S812 of the performance calculation method 800 are similar to operations S302-S312 of the performance calculation method 300, respectively.

Figure 9:
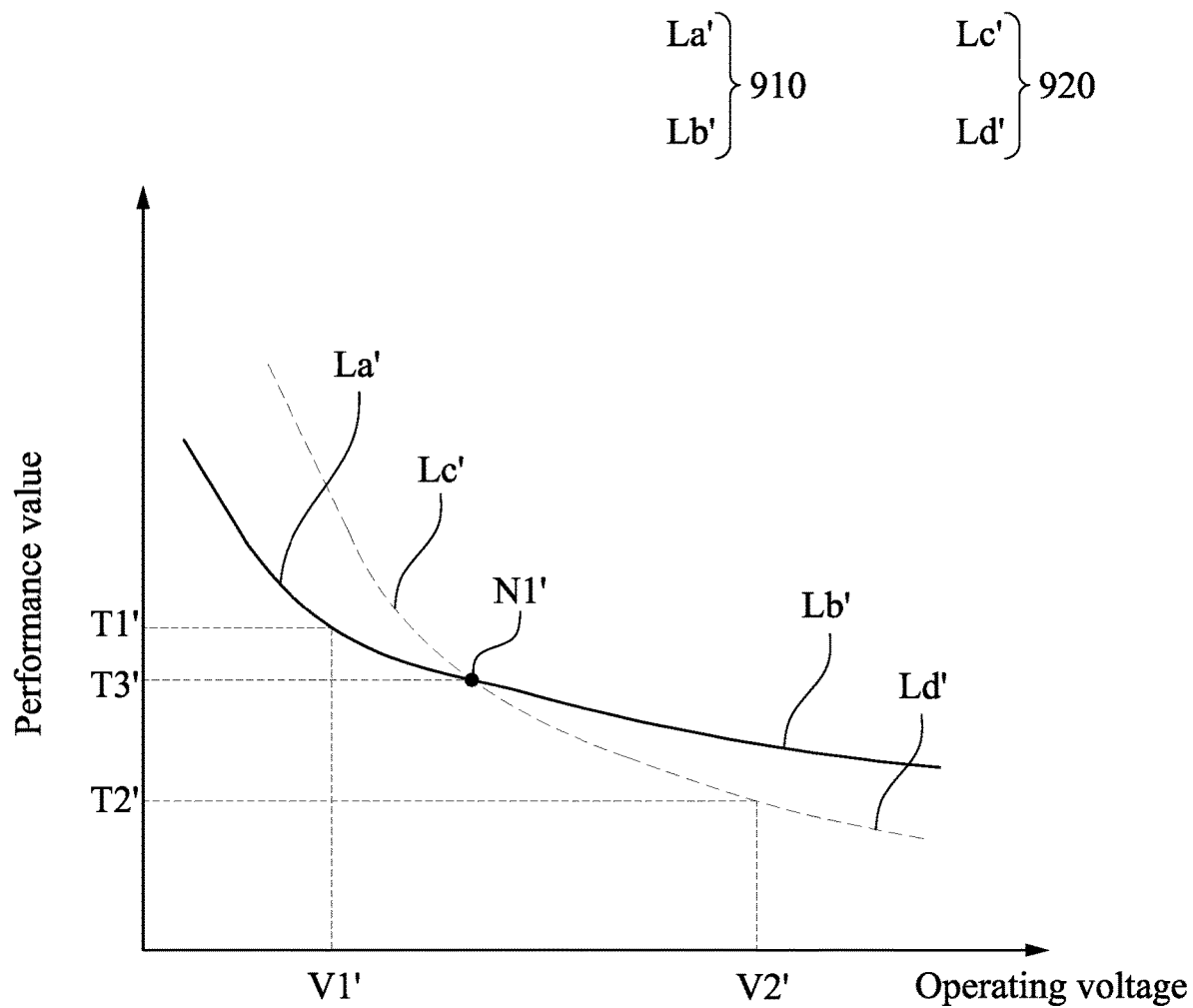
FIG. 9 is a schematic diagram of the graphs of the first function and the second function according to one embodiment of the present disclosure.

For example, referring to FIG. 9, to construct the first function "funs" in this embodiment, the electronic device 120 assigns the first weight values to the periods of the oscillation signals OS_1-OS_n, respectively, as the coefficients of the first function "funs." The electronic device 120 further sets the known first voltage value V1' and first performance value T1' (or a approximate value of the first performance value T1') as the input and output of the first function "funs," respectively, to evaluate the first weight values. In some embodiments, the curve 910 (indicated by a solid line) of FIG. 9 is the graph of the first function "funs."

As another example, to construct the second function "funb" in this embodiment, the electronic device 120 assigns the second weight values to the periods of the oscillation signal OS_1-OS_n, respectively, as the coefficients of the second function "funb." The electronic device 120 further sets the known second voltage value V2' and second performance value T2' (or an approximate value of the second performance value T2') to be the input and the output of the second function "funb," respectively, to evaluate the second weight values. In some embodiments, the curve 920 (indicated by a dashed line) of FIG. 9 is the graph of the second function "funb." Since operations S802-S812 are similar to operations S302-S312, those descriptions are omitted here. The following paragraphs will explain the performance calculation method 800 from operation S814.

In operation S814, the electronic device 120 determines if the output of the first unction "funs" is smaller than or equal to the second performance value T2' when the input of the first function "funs" is the second voltage value V2'. If so, the electronic device 120 conducts operation S816 to adjust the first weight values, so that the output of the first function "funs" becomes greater than the second performance value T2' when the input of the first function "funs" is the second voltage value V2'. If not, the electronic device 120 conducts operation S818.

In operation S818, the electronic device 120 determines if the output of the second function "funb" is smaller than or equal to the first performance value T1' when the input of the second function "funb" is the first voltage value V1'. If so, the electronic device 120 executes operation S820 to adjust the second weight values, so that the output of the second function "funb" becomes larger than the first performance value T1' when the input of the second function "funb" is the first voltage value V1'. If not, the electronic device 120 conducts operation S822.

In other words, the performance calculation methods 300 and 800 have different rules for trajectories of the graphs of the first function "funs" and the second function "funb." Therefore, the trajectories of the graphs of the first function "funs" and the second function "funb" are different in FIGS. 4 and 9.

As shown in FIG. 9, the curve 910 comprises a first curve segment La' and a second curve segment Lb' at a left side and a right side of a coordinate point N1', respectively. The curve 920 comprises a third curve segment Lc' and a fourth curve segment Ld' at a left side and a right side of a coordinate point N1', respectively.

Figure 10:
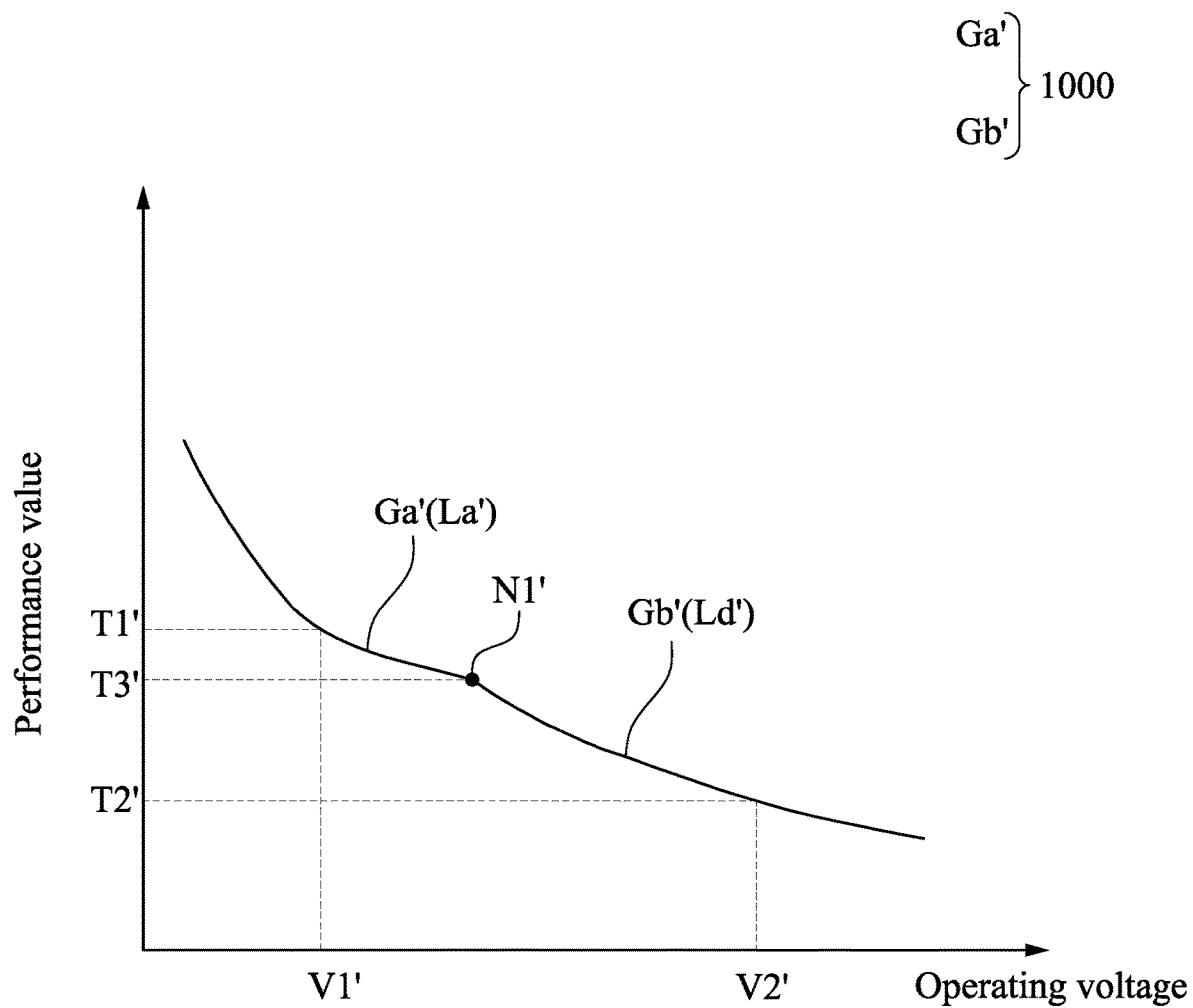
FIG. 10 is a schematic diagram of the graph of the performance function according to one embodiment of the present disclosure.

In operation S822, the electronic device 120 selects one of the first curve segment La' and the third curve segment Lc', in which the selected curve segment corresponds to a smaller one among two performance values of the chip 110 obtained by respectively mapping the operating voltage VDD through the first curve segment La' and the third curve segment Lc'. The selected curve segment will be the first part Ga' of the graph of the performance function. In this embodiment, as shown in FIG. 10, the electronic device 120 selects the first curve segment La' as the first part Ga' of the graph of the performance function.

In operation S824, the electronic device 120 selects one of the second curve segment Lb' and the fourth curve segment Ld', in which the selected curve segment corresponds to a smaller one among two performance values of the chip 110 obtained by respectively mapping the operating voltage VDD through the second curve segment Lb' and the fourth curve segment Ld'. The selected curve segment will be the second part Gb' of the graph of the performance function. In this embodiment, as shown in FIG. 10. The electronic device 120 selects the fourth curve segment Ld' as the second part Gb' of the graph of the performance function. As a result, the electronic device 120 generates the graph of the performance function in operation S820, which is a curve 1000 of FIG. 10 including the aforesaid first part Ga', the second part Gb', and the coordinate point N1'.

In operation S826, the electronic device 120 constructing the performance function according to the curve 1000. The performance function can be expressed by a formula similar to the Formula 3, and thus those descriptions will not be repeated here. As shown in FIG. 10, in some embodiments, the outputs (i.e., the range) of the performance function comprises the first performance value T1' or the approximate value of the first performance value T1', the second performance value T2' or the approximate value of the second performance value T2', and a third performance value T3' corresponding to the coordinate point N1'.

As can be appreciated from the foregoing descriptions, the performance calculation system 100 and the performance calculation methods 300 and 800 of the present disclosure take into account various variations of the chip 110 to precisely evaluate the performance of the chip 110 (e.g., the delay time of the critical path).

In addition, the calculation process of the performance calculation methods 300 and 800 are simple, helping to reduce periods of time analysis and requirements of relative hardware.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the present disclosure will be apparent to those skilled in the art from consideration of the specification and practice of the present disclosure disclosed herein. It is intended that the specification and examples be considered as exemplary only, with a true scope and spirit of the present disclosure being indicated by the following claims.

What is claimed is:

1. A performance calculation method, suitable for a chip comprising a plurality of oscillator circuit systems, wherein the plurality of oscillator circuit systems are configured to generate a plurality of oscillation signals and to sense operation states of the chip to adjust periods of the plurality of oscillation signals, and the performance calculation method comprises:

when the chip is in a first operation state, constructing a first function according to the periods of the plurality of oscillation signals, and according to a first performance value of the chip or an approximate value of the first performance value;

when the chip is in a second operation state, constructing a second function according to the periods of the plurality of oscillation signals, and according to a second performance value of the chip or an approximate value of the second performance value;

adjusting coefficients of the first function or coefficients of the second function according to trajectories of a graph of the first function and a graph of the second function, so that the graph of the first function and the graph of the second function intersect at a coordinate point; and constructing a performance function of the chip according to the first function and the second function.

2. The performance calculation method of claim 1, wherein an input/output (I/O) terminal of the chip is configured to receive an operating voltage, the first operation state refers to that the operating voltage has a first voltage value or the chip has a first temperature, and constructing the first function comprises:

receiving the plurality of oscillation signals from the plurality of oscillator circuit systems;

measuring the first performance value of the chip;

assigning a plurality of first weight values respectively to the periods of the plurality of oscillation signals as the coefficients of the first function to construct the first function; and setting the first voltage value or the first temperature to be an input of the first function, and setting the first performance value or the approximate value of the first performance value to be an output of the first function, so as to evaluate the plurality of first weight values.

3. The performance calculation method of claim 2, wherein the second operation state refers to that the operating voltage has a second voltage value or the chip has a second temperature, and constructing the second function comprises:

receiving the plurality of oscillation signals from the plurality of oscillator circuit systems;

measuring the second performance value of the chip;

assigning a plurality of second weight values respectively to the periods of the plurality of oscillation signals as the coefficients of the second function to construct the second function; and setting the second voltage value or the second temperature to be an input of the second function, and setting the second performance value or the approximate value of the second performance value to be an output of the second function, so as to evaluate the plurality of second weight values.

4. The performance calculation method of claim 3, wherein adjusting the coefficients of the first function or the coefficients of the second function according to the trajectories of the graph of the first function and the graph of the second function comprises:

if an output of the first function, obtained by setting the second voltage value to be an input of the first function, is greater than or equal to the second performance value, adjusting the coefficients of the first function; and if an output of the second function, obtained by setting the first voltage value to be an input of the second function, is greater than or equal to the first performance value, adjusting the coefficients of the second function.

5. The performance calculation method of claim 4, wherein the graph of the first function comprises a first curve segment and a second curve segment at a left side and a right side of the coordinate point, respectively, the graph of the second function comprises a third curve segment and a fourth curve segment at the left side and the right side of the coordinate point, respectively, and constructing the performance function of the chip comprises:

selecting one of the first curve segment and the third curve segment, which corresponding to a greater one among two performance values obtained by respectively mapping a corresponding voltage value through the first curve segment and the third curve segment, as a first part of a graph of the performance function;

selecting one of the second curve segment and the fourth curve segment, which corresponding to a greater one among two performance values obtained by respectively mapping another corresponding voltage value through the second curve segment and the fourth curve segment, as a second part of the graph of the performance function; and constructing the performance function according to the first part, the second part, and the coordinate point.

6. The performance calculation method of claim 3, wherein adjusting the coefficients of the first function or the coefficients of the second function according to the trajectories of the graph of the first function and the graph of the second function comprises:

if an output of the first function, obtained by setting the second voltage value to be an input of the first function, is smaller than or equal to the second performance value, adjusting the coefficients of the first function; and if an output of the second function, obtained by setting the first voltage value as an input of the second function, is smaller than or equal to the first performance value, adjusting the coefficients of the second function.

7. The performance calculation method of claim 6, wherein the graph of the first function comprises a first curve segment and a second curve segment at a left side and a right side of the coordinate point, respectively, the graph of the second function comprises a third curve segment and a fourth curve segment at the left side and the right side of the coordinate point, respectively, and constructing the performance function of the chip comprising:

selecting one of the first curve segment and the third curve segment, which corresponding to a smaller one among two performance values obtained by respectively mapping a corresponding voltage value through the first curve segment and the third curve segment, as a first part of a graph of the performance function;

selecting one of the second curve segment and the fourth curve segment, which corresponding to a smaller one among two performance values obtained by respectively mapping another corresponding voltage value through the second curve segment and the fourth curve segment, as a second part of the graph of the performance function; and constructing the performance function according to the first part, the second part, and the coordinate point.

8. The performance calculation method of claim 1, wherein a plurality of outputs of the performance function comprise the first performance value or the approximate value of the first performance value, the second performance value or the approximate value of the second performance value, and a third performance value corresponding to the coordinate point.

9. The performance calculation method of claim 1, wherein a difference between the first performance value and the approximate value of the first performance value is 0.1-1 percent of the first performance value, and a difference between the second performance value and the approximate value of the second performance value is 0.1-1 percent of the second performance value.

10. A performance calculation system, comprising:
an electronic device; and
a chip, coupled with the electronic device, and comprising:
   a plurality of oscillator circuit systems, configured to generate a plurality of oscillation signals, and configured to sense operation states of the chip to adjust periods of the plurality of oscillation signals; and
   a control circuit, coupled with the plurality of oscillator circuit systems, and configured to transmit the plurality of oscillation signals to the electronic device;
   wherein the electronic device is configured to:
      when the chip is in a first operation state, construct a first function according to the periods of the plurality of oscillation signals, and according to a first performance value of the chip or an approximate value of the first performance value;
      when the chip is in a second operation state, construct a second function according to the periods of the plurality of oscillation signals, and according to a second performance value of the chip or an approximate value of the second performance value;
      adjust coefficients of the first function or coefficients of the second function according to trajectories of a graph of the first function and a graph of the second function, so that the graph of the first function and the graph of the second function intersect at a coordinate point; and
      construct a performance function of the chip according to the first function and the second function.

11. The performance calculation system of claim 10, wherein an input/output (I/O) terminal of the chip is configured to receive an operating voltage, the first operation state refers to that the operating voltage has a first voltage value or the chip has a first temperature, and when the electronic device constructs the first function, the electronic device is further configured to:
   receive the plurality of oscillation signals from the control circuit;
   measure the first performance value of the chip;
   assign a plurality of first weight values respectively to the periods of the plurality of oscillation signals as the coefficients of the first function to construct the first function; and
   set the first voltage value or the first temperature to be an input of the first function, and set the first performance value or the approximate value of the first performance value to be an output of the first function, so as to evaluate the plurality of first weight values.

12. The performance calculation system of claim 11, wherein the second operation state refers to that the operating voltage has a second voltage value or the chip has a second temperature, and when the electronic device constructs the second function, the electronic device is further configured to:
   receive the plurality of oscillation signals from the control circuit;
   measure the second performance value of the chip;
   assign a plurality of second weight values respectively to the periods of the plurality of oscillation signals as the coefficients of the second function to construct the second function; and
   set the second voltage value or the second temperature as an input of the second function, and set the second performance value or the approximate value of the second performance value as an output of the second function, so as to evaluate the plurality of second weight values.

13. The performance calculation system of claim 12, wherein when the electronic device adjusts the coefficients of the first function and the coefficients of the second function according to the trajectories of the graph of the first function and the graph of the second function, the electronic device is further configured to:
   if an output of the first function, obtained by set the second voltage value as an input of the first function, is greater than or equal to the second performance value, adjust the coefficients of the first function; and
   if an output of a second function, obtained by set the first voltage value as an input of the second function, is greater than or equal to the first performance value, adjust the coefficients of the second function.

14. The performance calculation system of claim 13, wherein the graph of the first function comprises a first curve segment and a second curve segment at a left side and a right side of the coordinate point, respectively, the graph of the second function comprises a third curve segment and a fourth curve segment at the left side and the right side of the coordinate point, respectively, and when the electronic device constructs the performance function of the chip, the electronic device is further configured to:
   select one of the first curve segment and the third curve segment, which corresponding to a greater one among two performance values obtained by respectively mapping a corresponding voltage value through the first curve segment and the third curve segment, as a first part of a graph of the performance function;
   select one of the second curve segment and the fourth curve segment, which corresponding to a greater one among two performance values obtained by respectively mapping another corresponding voltage value through the second curve segment and the fourth curve segment, as a second part of the graph of the performance function; and
   construct the performance function according to the first part, the second part, and the coordinate point.

15. The performance calculation system of claim 12, wherein when the electronic device adjusts the coefficients of the first function or the coefficients of the second function according to the trajectories of the graph of the first function and the graph of the second function, the electronic device is further configured to:
   if an output of the first function, obtained by setting the second voltage value to be an input of the first function, is smaller than or equal to the second performance value, adjust the coefficients of the first function; and
   if an output of the second function, obtained by setting the first voltage value to be an input of the second function, is smaller than or equal to the first performance value, adjust the coefficients of the second function.

16. The performance calculation system of claim 15, wherein the graph of the first function comprises a first curve segment and a second curve segment at a left side and a right side of the coordinate point, respectively, the graph of the second function comprises a third curve segment and a fourth curve segment at the left side and the right side of the coordinate point, respectively, and when the electronic device constructs the performance function of the chip, the electronic device is further configured to:
- select one of the first curve segment and the third curve segment, which corresponding to a smaller one among two performance values obtained by respectively mapping a corresponding voltage value through the first curve segment and the third curve segment, as a first part of a graph of the performance function;
- select one of the second curve segment and the fourth curve segment, which corresponding to a smaller one among two performance values obtained by respectively mapping another corresponding voltage value through the second curve segment and the fourth curve segment, as a second part of the graph of the performance function; and
- construct the performance function according to the first part, the second part, and the coordinate point.

17. The performance calculation system of claim 10, wherein a plurality of outputs of the performance function comprises the first performance value or the approximate value of the first performance value, the second performance value or the approximate value of the second performance value, and a third performance value corresponding to the coordinate point.

18. The performance calculation system of claim 10, wherein a difference between the first performance value and the approximate value of the first performance value is 0.1-1% percent of the first performance value, and a difference between the second performance value and the approximate value of the second performance value is 0.1-1% of the second performance value.

19. An electronic device, for being coupled with a chip, wherein the chip comprises a plurality of oscillator circuit systems and a control circuit,
wherein the plurality of oscillator circuit systems are configured to generate a plurality of oscillation signals, and configured to sense operation states of the chip to adjust periods of the plurality of oscillation signals,
wherein the control circuit is coupled with the plurality of oscillator circuit systems, and configured to transmit the plurality of oscillation signals to the electronic device,
wherein the electronic device is configured to:
- when the chip is in a first operation state, construct a first function according to the periods of the plurality of oscillation signals, and according to a first performance value of the chip or an approximate value of the first performance value;
- when the chip is in a second operation state, construct a second function according to the periods of the plurality of oscillation signals, and according to a second performance value of the chip or an approximate value of the second performance value;
- adjusting coefficients of the first function or coefficients of the second function according to trajectories of a graph of the first function and a graph of the second function, so that the graph of the first function and the graph of the second function intersects at a coordinate point; and
- construct a performance function of the chip according to the first function and the second function.

20. The electronic device of claim 19, wherein a plurality of outputs of the performance function comprises the first performance value or the approximate value of the first performance value, the second performance value or the approximate value of the second performance value, and a third performance value corresponding to the coordinate point.

* * * * *